US012505798B2

(12) United States Patent
Yang et al.

(10) Patent No.: US 12,505,798 B2
(45) Date of Patent: Dec. 23, 2025

(54) PIXEL AND DISPLAY DEVICE INCLUDING THE SAME

(71) Applicant: Samsung Display Co., LTD., Yongin-si (KR)

(72) Inventors: Gun Woo Yang, Yongin-si (KR); Hyun Young Choi, Yongin-si (KR); Hae Ryeong Park, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 0 days.

(21) Appl. No.: 18/541,247

(22) Filed: Dec. 15, 2023

(65) Prior Publication Data

US 2024/0386849 A1 Nov. 21, 2024

(30) Foreign Application Priority Data

May 17, 2023 (KR) ........................ 10-2023-0063989

(51) Int. Cl.

*G09G 3/3233* (2016.01)
*H10D 86/40* (2025.01)
*H10D 86/60* (2025.01)

(52) U.S. Cl.

CPC ......... *G09G 3/3233* (2013.01); *H10D 86/441* (2025.01); *H10D 86/60* (2025.01); *G09G 2300/0819* (2013.01); *G09G 2300/0842* (2013.01); *G09G 2300/0861* (2013.01); *G09G 2320/0257* (2013.01)

(58) Field of Classification Search

CPC ......... G09G 3/3233; G09G 2300/0819; G09G 2300/0842; G09G 2300/0861; G09G 2300/0257; H10D 86/441; H10D 86/60

See application file for complete search history.

(56) References Cited

U.S. PATENT DOCUMENTS

| | | | | |
|---|---|---|---|---|
| 11,443,687 | B2 | 9/2022 | Son et al. | |
| 11,568,801 | B2 * | 1/2023 | Park | G09G 3/3233 |
| 2012/0001893 | A1 * | 1/2012 | Jeong | G09G 3/3233 345/76 |
| 2018/0047335 | A1 * | 2/2018 | Hwang | G09G 3/2092 |

(Continued)

FOREIGN PATENT DOCUMENTS

| | | |
|---|---|---|
| KR | 10-2021-0148475 | 12/2021 |
| KR | 10-2022-0092721 | 7/2022 |
| KR | 10-2022-0097824 | 7/2022 |

*Primary Examiner* — Ariel A Balaoing

(74) *Attorney, Agent, or Firm* — Harness, Dickey & Pierce, P.L.C.

(57) ABSTRACT

A pixel includes: a first transistor including a gate electrode connected to a first node, a first electrode connected to a first power line for receiving a first driving power voltage via a second node, and a second electrode connected to a third node; a light-emitting element including a first electrode connected to the third node, and a second electrode connected to a second power line; a second transistor connected between a data line and the second node, and including a gate electrode connected to a first scan line; and a third transistor connected between the first node and a third power line for receiving an initialization power voltage. The second transistor is set to a turn-on state during at least a portion of a turn-on period of the third transistor. The initialization power voltage is set to be lower than a data signal.

13 Claims, 12 Drawing Sheets

(56) References Cited

U.S. PATENT DOCUMENTS

| | | | | |
|---|---|---|---|---|
| 2019/0164494 | A1* | 5/2019 | Bae | G09G 3/3258 |
| 2019/0340981 | A1* | 11/2019 | Pyo | G09G 3/3291 |
| 2020/0066212 | A1* | 2/2020 | Kim | G09G 3/3266 |
| 2020/0111418 | A1* | 4/2020 | Nam | G09G 3/3233 |
| 2020/0394962 | A1* | 12/2020 | Seo | G09G 3/3275 |
| 2020/0402432 | A1* | 12/2020 | Yang | G09G 3/3233 |
| 2021/0201764 | A1* | 7/2021 | Oh | G09G 3/3233 |
| 2021/0335167 | A1* | 10/2021 | Lee | G09G 3/2092 |
| 2021/0375193 | A1* | 12/2021 | Son | G09G 3/3233 |
| 2022/0208088 | A1 | 6/2022 | Kim et al. | |
| 2022/0208929 | A1 | 6/2022 | Min et al. | |

* cited by examiner

PIXEL AND DISPLAY DEVICE INCLUDING THE SAME

CROSS-REFERENCE TO RELATED APPLICATION(S)

The application claims priority to and benefits of Korean patent application number 10-2023-0063989 under 35 U.S.C. § 119, filed on May 17, 2023, the entire contents of which are incorporated herein by reference.

BACKGROUND

1. Technical Field

Various embodiments relate to a pixel and a display device including the pixel.

2. Description of Related Art

With the development of information technology, the importance of a display device, which is a connection medium between a user and information, has been emphasized. Owing to the importance of display devices, the usage of various kinds of display devices, such as a liquid crystal display device and an organic light-emitting display device, has increased.

The display device may include pixels for displaying an image. Each of the pixels may generate a specific luminance of light by controlling the amount of the current supplied to a light emitting element by using a driving transistor. In the case where the pixel displays a high luminance of image (e.g., a white image) after displaying a low luminance of image (e.g., a black image), momentary residual images may occur due to hysteresis of the driving transistor.

SUMMARY

Various embodiments provide a pixel and a display device including the pixel capable of preventing or minimizing a momentary residual image phenomenon caused by hysteresis of a driving transistor.

However, embodiments of the disclosure are not limited to those set forth herein. The above and other embodiments will become more apparent to one of ordinary skill in the art to which the disclosure pertains by referencing the detailed description of the disclosure given below.

In an embodiment, a pixel may include: a first transistor including a gate electrode connected to a first node, a first electrode connected to a first power line via a second node, the first power line that receives a first driving power voltage, and a second electrode connected to a third node; a light emitting element including a first electrode connected to the third node, and a second electrode connected to a second power line that receives a second driving power voltage; a second transistor connected between a data line and the second node, and including a gate electrode electrically connected to a first scan line; and a third transistor connected between the first node and a third power line that receives initialization power voltage, and including a gate electrode electrically connected to a second scan line. The second transistor may be set to a turn-on state during at least a partial period of a turn-on period of the third transistor. The initialization power voltage may be set to a voltage lower than a data signal to be supplied to the data line.

In an embodiment, the pixel may further include a fourth transistor connected between the first node and the third node, and including a gate electrode electrically connected to a third scan line.

In an embodiment, the second transistor may be set to a turn-on state during at least a partial period of a turn-on period of the fourth transistor. The turn-on period of the third transistor may not overlap the turn-on period of the fourth transistor.

In an embodiment, the pixel may further include a fifth transistor connected between the first electrode of the light emitting element and the third power line, and including a gate electrode electrically connected to a fourth scan line.

In an embodiment, the fifth transistor and the second transistor may be turned on or turned off simultaneously. The fourth scan line and the first scan line may be set to a same scan line.

In an embodiment, the fifth transistor may be turned on during at least a partial period after the second transistor is turned on or turned off.

In an embodiment, the pixel may further include: a sixth transistor connected between the first power line and the second node, and including a gate electrode electrically connected to an emission control line; and a seventh transistor connected between the third node and the first electrode of the light emitting element, and including a gate electrode electrically connected to the emission control line.

In an embodiment, a pixel may include: a first transistor including a gate electrode connected to a first node, a first electrode connected to a first power line via a second node, the first power line that receives a first driving power voltage, and a second electrode connected to a third node; a light emitting element including a first electrode connected to the third node, and a second electrode connected to a second power line that receives a second driving power voltage; a second transistor connected between a data line and the second node, and including a gate electrode electrically connected to a first scan line; a third transistor connected between the first node and a third power line that receives an initialization power voltage, and including a gate electrode electrically connected to a second scan line; and a bias transistor including a first electrode electrically connected to a fourth power line that receives a bias power voltage, a second electrode connected to the second node or the third node, and a gate electrode electrically connected to the second scan line. The bias power voltage may be set to a voltage higher than the initialization power voltage.

In an embodiment, the second electrode of the bias transistor may be connected to the second node.

In an embodiment, the second electrode of the bias transistor may be connected to the third node.

In an embodiment, the pixel may further include: a fourth transistor connected between the first node and the third node, and including a gate electrode electrically connected to a third scan line; and a fifth transistor connected between the first electrode of the light emitting element and the third power line, and including a gate electrode electrically connected to a fourth scan line. A turn-on period of the second transistor may overlap a turn-on period of the fourth transistor during at least a partial period.

In an embodiment, the fifth transistor and the second transistor may be turned on or turned off simultaneously. The fourth scan line and the first scan line may be set to a same scan line.

In an embodiment, the fifth transistor may be turned on during at least a partial period after the second transistor is turned on or turned off.

In an embodiment, the pixel may further include: a sixth transistor connected between the first power line and the second node, and including a gate electrode electrically connected to an emission control line; and a seventh transistor connected between the third node and the first electrode of the light emitting element, and including a gate electrode electrically connected to the emission control line.

In an embodiment, a display device may include pixels connected to first scan lines, second scan lines, third scan lines, fourth scan lines, data lines, and emission control lines. A pixel among the pixels positioned on an i-th pixel row and a j-th pixel column, where i and j are an integer of 0 or more, may include: a first transistor including a gate electrode connected to a first node, a first electrode connected to a first power line via a second node, the first power line that receives a first driving power voltage, and a second electrode connected to a third node; a light emitting element including a first electrode connected to the third node, and a second electrode connected to a second power line that receives a second driving power voltage; a second transistor connected between a j-th data line and the second node, and configured to be turned on in case that a first scan signal is supplied to an i-th first scan line; and a third transistor connected between the first node and a third power line that receives an initialization power voltage, and configured to be turned on in case that a second scan signal is supplied to an i-th second scan line. During one frame period, at least two or more first scan signals may be supplied to the i-th first scan line, and the second scan signal supplied to the i-th second scan line may overlap one of the at least two or more first scan signals supplied to the i-th first scan line.

In an embodiment, the pixel positioned on the i-th pixel row and the j-th pixel column may further include: a fourth transistor connected between the first node and the third node, and configured to be turned on in case that a third scan signal is supplied to an i-th third scan line; a fifth transistor connected between the first electrode of the light emitting element and the third power line, and configured to be turned on in case that a fourth scan signal is supplied to an i-th fourth scan line; a sixth transistor connected between the first power line and the second node, and configured to be turned off in case that an emission control signal is supplied to a k-th emission control line, where k is an integer of 0 or more; and a seventh transistor connected between the third node and the first electrode of the light emitting element, and configured to be turned off in case that the emission control signal is supplied to the k-th emission control line.

In an embodiment, a period during which the pixel positioned on the i-th pixel row and the j-th pixel column is driven is divided into a first period, a second period, and a third period. The display device may further include: a data driver that supplies a data signal to the j-th data line; a first scan driver that supplies the one of the at least two or more first scan signals to the i-th first scan line during the first period, and that supplies another one of the at least two or more first scan signals to the i-th first scan line during the second period; a second scan driver that supplies a second scan signal to the i-th second scan line during the first period; a third scan driver that supplies a third scan signal to the i-th third scan line during the second period; and an emission driver that supplies an emission control signal to the k-th emission control line during the first period to the third period, and that does not supply the emission control signal to the k-th emission control line during a remaining period.

In an embodiment, the i-th fourth scan line and the i-th first scan line may be set to a same scan line.

In an embodiment, the display device may further include a fourth scan driver that supplies a fourth scan signal to the i-th fourth scan line during the third period.

In an embodiment, a display device may include pixels connected to first scan lines, second scan lines, third scan lines, fourth scan lines, data lines, and emission control lines. A pixel among the pixels positioned on an i-th pixel row and a j-th pixel column, where i and j are an integer of 0 or more, may include: a first transistor including a gate electrode connected to a first node, a first electrode connected to a first power line via a second node, the first power line that receives a first driving power voltage, and a second electrode connected to a third node; a light emitting element including a first electrode connected to the third node, and a second electrode connected to a second power line that receives a second driving power voltage; a second transistor connected between a j-th data line and the second node, and configured to be turned on in case that a first scan signal is supplied to an i-th first scan line; a third transistor connected between the first node and a third power line that receives an initialization power voltage, and configured to be turned on in case that a second scan signal is supplied to an i-th second scan line; a fourth transistor connected between the first node and the third node, and configured to be turned on in case that a third scan signal is supplied to an i-th third scan line; a fifth transistor connected between the first electrode of the light emitting element and the third power line, and configured to be turned on in case that a fourth scan signal is supplied to an i-th fourth scan line; a sixth transistor connected between the first power line and the second node, and configured to be turned off in case that an emission control signal is supplied to a k-th emission control line, where k is an integer of 0 or more; a seventh transistor connected between the third node and the first electrode of the light emitting element, and configured to be turned off in case that the emission control signal is supplied to the k-th emission control line; and a bias transistor including a first electrode electrically connected to a fourth power line that receives a bias power voltage, and a second electrode connected to the second node or the third node. The bias transistor may be turned on in case that the second scan signal is supplied to the i-th second scan line.

The objects of the disclosure are not limited to the above-stated object, and those skilled in the art will clearly understand other not mentioned objects from the accompanying claims.

DETAILED DESCRIPTION OF THE EMBODIMENTS

Figure 1:
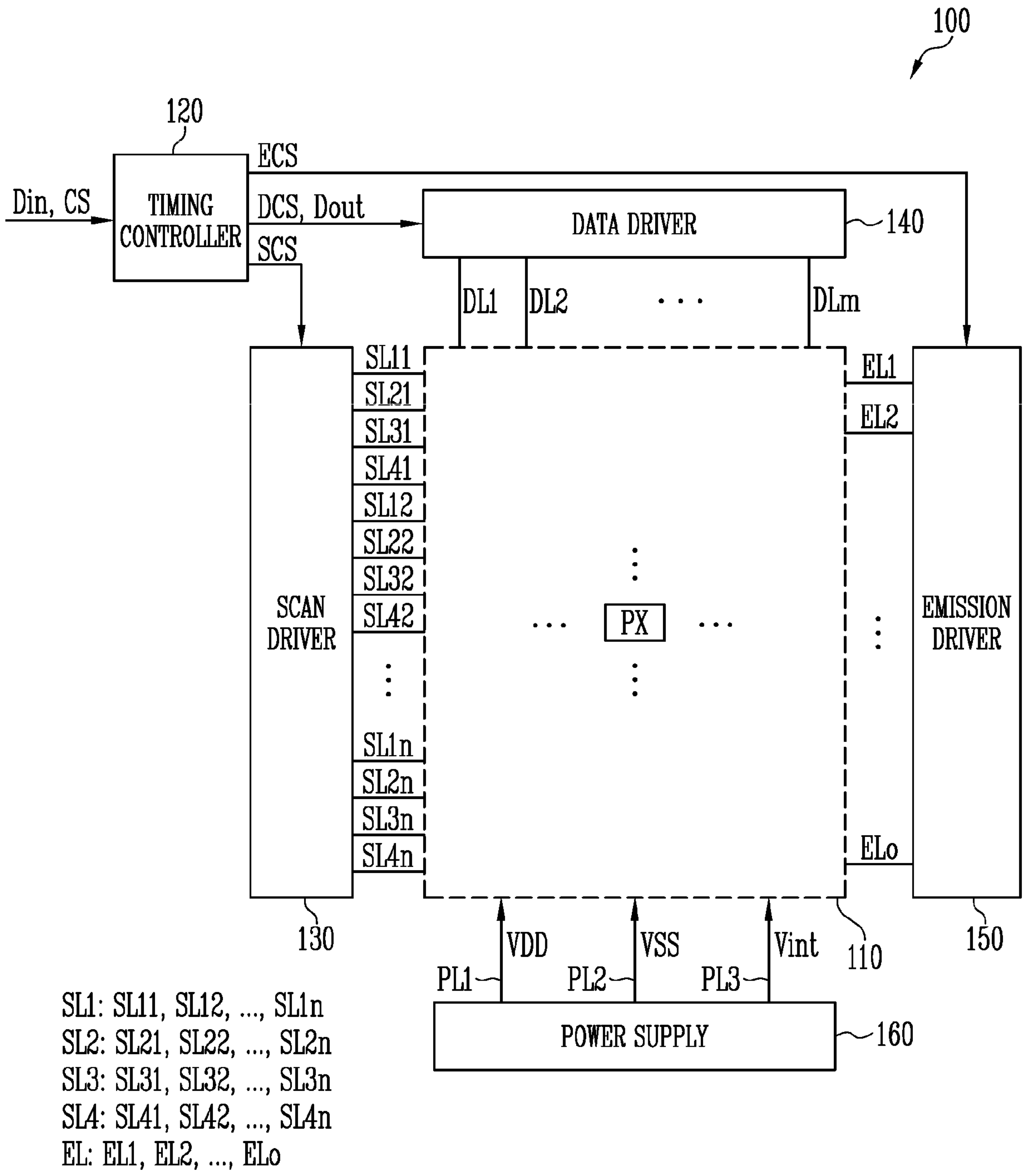
FIG. 1 is a schematic diagram illustrating a display device in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

However, embodiments are not limited to the following embodiments and may be modified into various forms. Each embodiment to be described below may be implemented alone, or combined with at least another embodiment to make various combinations of embodiments.

Figure 2:
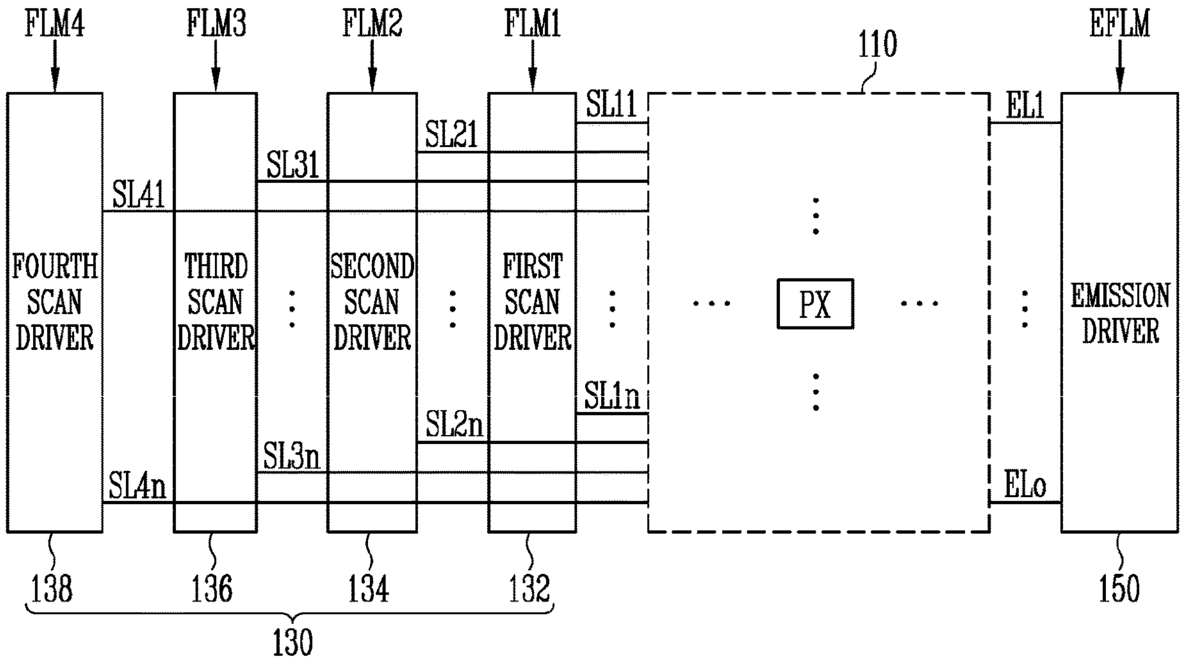
FIG. 2 is a schematic diagram illustrating an embodiment a scan driver and an emission driver that are shown in FIG. 1.

FIG. 1 is a schematic diagram illustrating a display device 100 in accordance with an embodiment. FIG. 2 is a schematic diagram illustrating an embodiment a scan driver 130 and an emission driver 150 that are illustrated in FIG. 1.

Referring to FIG. 1, a display device 100 in accordance with an embodiment may include a pixel component 110 (or a panel), a timing controller 120, the scan driver 130, a data driver 140, the emission driver 150, and a power supply 160. The aforementioned components may be implemented as separate integrated circuits. Two or more components of the aforementioned components may be implemented into a single integrated circuit. Furthermore, the scan driver 130 and/or the emission driver 150 may be formed in the pixel component 110.

The pixel component 110 may include pixels PX that are connected to first scan lines SL11, SL12, . . . , and SL1*n*, second scan lines SL21, SL22, . . . , and SL2*n*, third scan lines SL31, SL32, . . . , and SL3*n*, fourth scan lines SL41, SL42, . . . , and SL4*n*, data lines DL1, DL2, . . . , and DLm, emission control lines EL1, EL2, . . . , and ELo, and power lines PL1, PL2, and PL3, where n, m, and o are integers of 0 or more.

For example, a pixel PXij (refer to FIG. 3A) positioned on an i-th horizontal line (or pixel row) and a j-th vertical line (or pixel column) may be connected to an i-th first scan line SL1*i*, an i-th second scan line SL2*i*, an i-th third scan line SL3*i*, an i-th fourth scan line SL4*i*, a k-th emission control line ELk, and a j-th data line DLj, where i is an integer of n or less, j is an integer of m or less, and k is an integer of o or less. Here, k may be a number identical to or less than i. For example, in the case where each of the emission control lines EL1 to ELo is connected to pixels PX positioned on one horizontal line, k may be a number identical to i. For example, in the case where each of the emission control lines EL1 to ELo is connected to pixels PX positioned on two or more horizontal lines, k may be a number less than i.

The pixels PX may be selected based on each horizontal line. For example, pixels PX connected to the same scan line may be grouped into a single horizontal line (or pixel row) in case that a first scan signal is supplied to the first scan lines SL11 to SL1*n*. Each of the pixels PX that are selected by the first scan signal may receive a data signal from a corresponding data line (e.g., any one of DL1 to DLm) connected therewith. The pixels PX that receive data signals may generate certain luminances of light in response to voltages of the data signals.

The scan driver 130 may receive a scan driving signal SCS from the timing controller 120. The scan driving signal SCS may include at least one scan start signal and clock signals for driving the scan driver 130. The scan driver 130 may generate a first scan signal, a second scan signal, a third scan signal, and a fourth scan signal by shifting the scan start signal in response to the clock signals.

As illustrated in FIG. 2, the scan driver 130 may include a first scan driver 132, a second scan driver 134, a third scan driver 136, and a fourth scan driver 138.

The first scan driver 132 may receive a first scan start signal FLM1 and generate a first scan signal by shifting the first scan start signal FLM1 in response to a clock signal. The first scan driver 132 may sequentially supply the first scan signals to the first scan lines SL11 to SL1*n*.

The second scan driver 134 may receive a second scan start signal FLM2 and generate a second scan signal by shifting the second scan start signal FLM2 in response to a clock signal. The second scan driver 134 may sequentially supply the second scan signals to the second scan lines SL21 to SL2*n*.

The third scan driver 136 may receive a third scan start signal FLM3 and generate a third scan signal by shifting the third scan start signal FLM3 in response to a clock signal. The third scan driver 136 may sequentially supply the third scan signals to the third scan lines SL31 to SL3*n*.

The fourth scan driver 138 may receive a fourth scan start signal FLM4 and generate a fourth scan signal by shifting the fourth scan start signal FLM4 in response to a clock signal. The fourth scan driver 138 may sequentially supply the fourth scan signals to the fourth scan lines SL41 to SL4*n*. Each of the first scan signal, the second scan signal, the third scan signal, and the fourth scan signal may be set to a gate-on voltage such that the transistors included in the pixels PX may be turned on.

Figure 3A:
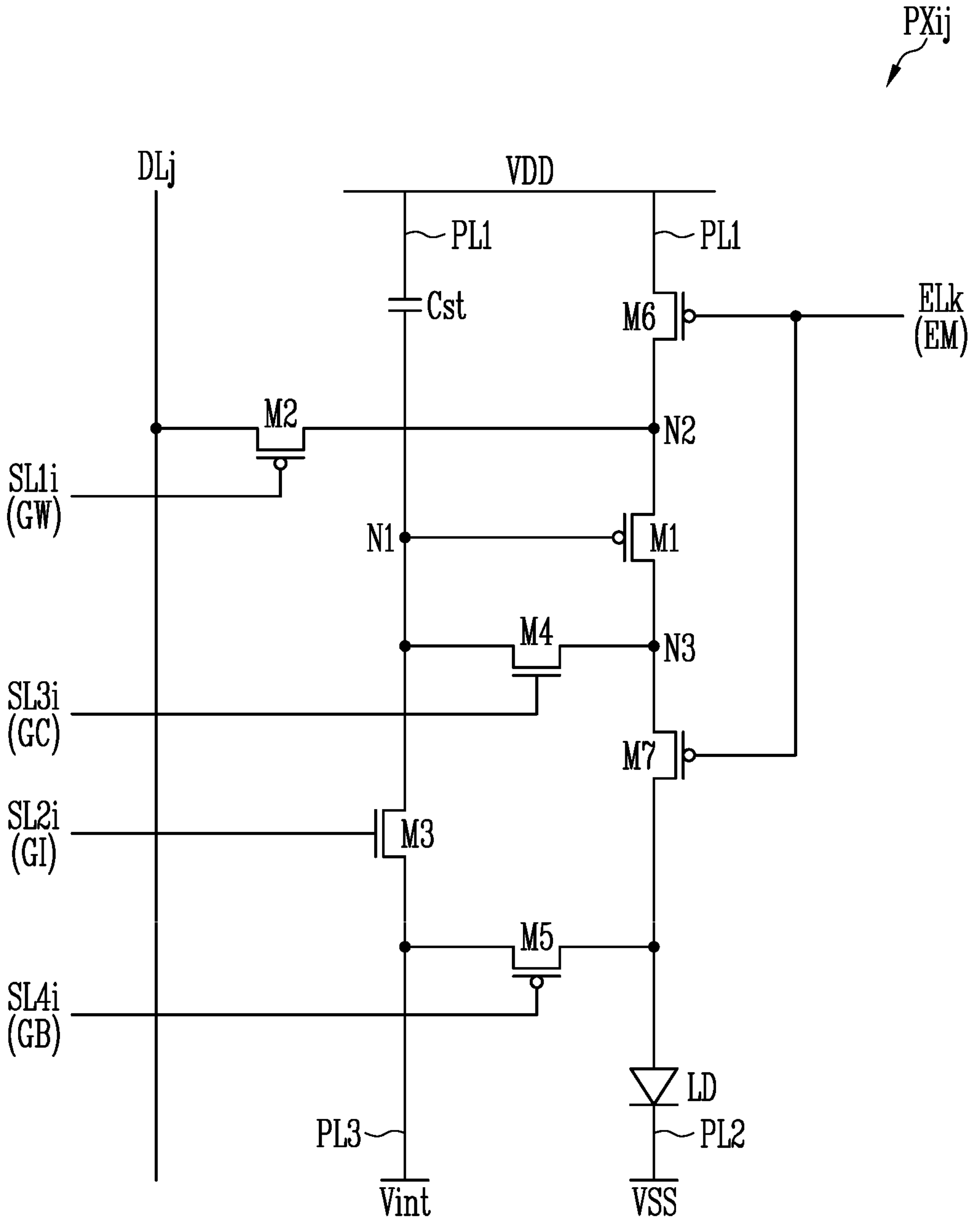
FIG. 3A is a schematic diagram illustrating an embodiment of a pixel shown in FIG. 1.

For example, as illustrated in FIG. 3A, a first scan signal GW and a fourth scan signal GB that are to be supplied to P-type transistors may be set to a low level. For instance, a second scan signal GI and a third scan signal GC that are to be supplied to N-type transistors may be set to a high level. Each transistor supplied with the first scan signal GW, the second scan signal GI, the third scan signal GC, or the fourth scan signal GB may be turned on in response to the first scan signal GW, the second scan signal GI, the third scan signal GC, or the fourth scan signal GB. Thereafter, the supply of the first scan signal GW, the second scan signal GI, the third scan signal GC, or the fourth scan signal GB may indicate (or mean) that a gate-on voltage is supplied to the first scan line SL1, the second scan line SL2, the third scan line SL3, or the fourth scan line SL4. The non-supply of the first scan signal GW, the second scan signal GI, the third scan signal GC, or the fourth scan signal GB may indicate (or mean) that a gate-off voltage is supplied to the first scan line SL1, the second scan line SL2, the third scan line SL3, or the fourth scan line SL4.

Although FIG. 2 illustrates that the first scan driver 132, the second scan driver 134, the third scan driver 136, and the fourth scan driver 138 are respectively connected to the first scan line SL1, the second scan line SL2, the third scan line SL3, and the fourth scan line SL4, embodiments are not limited thereto. For example, at least two scan lines among the first scan line SL1, the second scan line SL2, the third scan line SL3, and the fourth scan line SL4 (e.g., at least two of SL1, SL2, SL3, and SL4) may be driven by a single scan driver.

The data driver 140 may receive output data Dout and a data driving signal DCS from the timing controller 120. The data driving signal DCS may include a sampling signal and/or timing signals for driving the data driver 140. The data driver 140 may generate data signals, based on the data driving signal DCS and the output data Dout. For example, the data driver 140 may generate an analog data signal, based on a grayscale value of the output data Dout. The data driver 140 may supply data signals in units of one horizontal period or by each interval of one horizontal period.

The emission driver 150 may receive an emission driving signal ECS from the timing controller 120. The emission driving signal ECS may include an emission start signal and clock signals for driving the emission driver 150. The emission driver 150 may generate emission control signals EM by shifting the emission start signal in response to the clock signals.

As illustrated in FIGS. 2 and 3A, the emission driver 150 may receive an emission start signal EFLM, and generate emission control signals EM by shifting the emission start signal EFLM in response to the clock signals. The emission driver 150 may successively supply the emission control signals EM to the emission control lines EL1 to ELo. Each of the emission control signals EM may be set to a gate-off voltage such that the transistors included in the pixels PX may be turned off.

For example, as illustrated in FIG. 3A, the emission control signal EM that is supplied to a P-type transistor may be set to a high level, as illustrated in FIG. 3A. The transistor that receives the emission control signal EM may be turned off in response to the emission control signal EM. Thereafter, the supply of the emission control signal may indicate (or mean) that a gate-off voltage is supplied to the emission control line EL. The non-supply of the emission control signal may indicate (or mean) that a gate-on voltage is supplied to the emission control line EL.

The timing controller 120 may receive input data Din and a control signal CS from a host system through an interface. For example, the timing controller 120 may receive input data Din and a control signal CS from at least one of a graphics processing unit (GPU), a central processing unit (CPU), and an application processor (AP) that are included in the host system. The control signal CS may include various signals including a clock signal.

The timing controller 120 may generate a scan driving signal SCS, a data driving signal DCS, and an emission driving signal ECS, based on the control signal CS. The scan driving signal SCS, the data driving signal DCS, and the emission driving signal ECS may be respectively supplied to the scan driver 130, the data driver 140, and the emission driver 150.

The timing controller 120 may rearrange (or modify) the input data Din according to specifications of the display device 100. Furthermore, the timing controller 120 may correct the input data Din to generate output data Dout, and supply the output data Dout to the data driver 140. In an embodiment, the timing controller 120 may correct the input data Din in response to optical measurement results obtained during the manufacturing process.

The power supply 160 may generate various power voltages for driving the display device 100. For example, the power supply 160 may generate a first driving power voltage (or a first driving power supply) VDD, a second driving power voltage (or a second driving power supply) VSS, and an initialization power voltage (or an initialization power supply) Vint.

The first driving power voltage VDD may be provided to supply driving current to the pixels PX. The second driving power voltage VSS may be provided to receive the driving current from the pixels PX. During a period in which the pixels PX are set to a light-emitting state, the first driving power voltage VDD may be set to a voltage higher than that of the second driving power voltage VSS.

The initialization power voltage Vint may be a voltage to initialize a gate electrode of the driving transistor included in each of the pixels PX and a first electrode (or an anode electrode) of a light emitting element LD (refer to FIG. 3A). The initialization power voltage Vint may be set to a voltage lower than that of a data signal.

The first driving power voltage VDD generated from the power supply 160 may be supplied to the first power line PL1. The second driving power voltage VSS may be supplied to the second power line PL2. The initialization power voltage Vint may be supplied to the third power line PL3. The first power line PL1, the second power line PL2, and the third power line PL3 may be connected in common to the pixels PX, but embodiments are not limited thereto.

In an embodiment, the first power line PL1 may include a plurality of power lines. The power lines may be connected to different pixels. In an embodiment, the second power line PL2 may include a plurality of power lines. The power lines may be connected to different pixels. In an embodiment, the third power line PL3 may include a plurality of power lines. The power lines may be connected to different pixels. In an embodiment, the pixels PX may be connected to any one of the first power lines PL1, any one of the second power lines PL2, and any one of the third power lines PL3.

FIG. 3A is a schematic diagram illustrating an embodiment of a pixel illustrated in FIG. 1. In FIG. 3A, a pixel PXij may be positioned on the i-th horizontal line and the j-th vertical line.

Referring to FIG. 3A, the pixel PXij in accordance with an embodiment may be connected to the corresponding signal lines SL1*i*, SL2*i*, SL3*i*, SL4*i*, ELk, and DLj. For example, the pixel PXij may be connected to the i-th first scan line SL1*i*, the i-th second scan line SL2*i*, the i-th third scan line SL3*i*, the i-th fourth scan line SL4*i*, the k-th emission control line ELk, and the j-th data line DLj. In an embodiment, the pixel PXij may be also connected to the first power line PL1, the second power line PL2, and the third power line PL3.

The pixel PXij in accordance with an embodiment may include a light emitting element LD, and a pixel circuit that controls the amount of the current, which is supplied to the light emitting element LD.

The light emitting elements LD may be connected between the first power line PL1 and the second power line PL2. For example, a first electrode (or an anode electrode) of the light emitting element LD may be electrically connected to the first power line PL1 via a seventh transistor M7, a third node N3, a first transistor M1, a second node N2, and a sixth transistor M6. A second electrode (or a cathode electrode) of the light emitting element LD may be electrically connected to the second power line PL2. The light emitting element LD may generate light having a luminance corresponding to the amount of driving current that is supplied from the first power line PL1 to the second power line PL2 via the pixel circuit.

An organic light emitting diode may be selected as the light emitting element LD. Furthermore, an inorganic light emitting diode such as a micro light emitting diode (LED) or a quantum dot light emitting diode may be selected as the light emitting element LD. The light emitting element LD may be an element formed of a combination of organic material and inorganic material. Although FIG. 3A illustrates that the pixel PXij includes a single light emitting element LD, the pixel PXij in an embodiment may include a plurality of light emitting elements LD. The plurality of light emitting elements LD may be connected in series, parallel or series-parallel to each other.

The pixel circuit may include the first transistor M1, a second transistor M2, a third transistor M3, a fourth transistor M4, a fifth transistor M5, the sixth transistor M6, the seventh transistor M7, and a storage capacitor Cst.

The first transistor (or a driving transistor) M1 may include a first electrode connected to the second node N2, and a second electrode connected to the third node N3. A gate electrode of the first transistor M1 may be connected to a first node N1. Here, the term "connected" may include the meaning of being electrically connected. The first transistor M1 may control, in response to the voltage of the first node N1, the amount of the current to be supplied from the first driving power supply VDD to the second driving power supply VSS via the light emitting element LD.

The second transistor M2 may be connected between the data line DLj and the second node N2. A gate electrode of the second transistor M2 may be electrically connected to the first scan line SL1*i*. In case that a first scan signal GW is supplied to the first scan line SL1*i*, the second transistor M2 may be turned on to electrically connect the data line DLj to the second node N2.

The third transistor M3 may include a first electrode connected to the first node N1, and a second electrode electrically connected to the third power line PL3. A gate electrode of the third transistor M3 may be electrically connected to the second scan line SL2*i*. In case that a second scan signal GI is supplied to the second scan line SL2*i*, the third transistor M3 may be turned on so that the voltage of the initialization power supply Vint may be supplied to the first node N1. The initialization power supply Vint may be set to a voltage lower than that of a data signal to be supplied to the data line DLj.

The fourth transistor M4 may be connected between the first node N1 and the third node N3. A gate electrode of the fourth transistor M4 may be electrically connected to the third scan line SL3*i*. In case that a third scan signal GC is supplied to the third scan line SL3*i*, the fourth transistor M4 may be turned on to electrically connect the first node N1 to the third node N3. In case that the fourth transistor M4 is turned on, the first transistor M1 may be connected in the form of a diode.

The fifth transistor M5 may include a first electrode connected to the first electrode of the light emitting element LD, and a second electrode electrically connected to the third power line PL3. A gate electrode of the fifth transistor M5 may be electrically connected to the fourth scan line SL4*i*. In case that a fourth scan signal GB is supplied to the fourth scan line SL4*i*, the fifth transistor M5 may be turned on so that the voltage of the initialization power supply Vint may be supplied to the first electrode of light emitting element LD.

In case that the voltage of the initialization power supply Vint is supplied to the first electrode of the light emitting element LD, a parasitic capacitor of the light emitting element LD may be discharged (or initialized). As a residual voltage charged into the parasitic capacitor of the light emitting element LD is discharged (or removed), unintended faint emission may be prevented. Therefore, the black expression performance of the pixel PXij may be enhanced.

The sixth transistor M6 may include a first electrode electrically connected to the first power line PL1, and a second electrode connected to the second node N2. A gate electrode of the sixth transistor M6 may be connected to the emission control line ELk. The sixth transistor M6 may be turned off in case that an emission control signal EM is supplied to the emission control line ELk, and may be turned on in case that the emission control signal EM is not supplied thereto.

The seventh transistor M7 may be connected between the third node N3 and the first electrode of the light emitting element LD. A gate electrode of the seventh transistor M7 may be electrically connected to the emission control line ELk. The seventh transistor M7 may be turned off in case that the emission control signal EM is supplied to the emission control line ELk, and may be turned on in case that the emission control signal EM is not supplied thereto.

Although FIG. 3A illustrates that the sixth transistor M6 and the seventh transistor M7 are connected to the same emission control line ELk, embodiments are not limited thereto. In an embodiment, the sixth transistor M6 and the seventh transistor M7 may be connected to different emission control lines.

The storage capacitor Cst may be connected between the first power line PL1 and the first node N1. The storage capacitor Cst may store a voltage applied to the first node N1.

In an embodiment, each of the first transistor M1, the second transistor M2, the fifth transistor M5, the sixth transistor M6, and the seventh transistor M7 may be formed as a poly-silicon semiconductor transistor. For example, each of the first transistor M1, the second transistor M2, the fifth transistor M5, the sixth transistor M6, and the seventh transistor M7 may include, as an active layer (or channel region), a poly-silicon semiconductor layer formed by a low temperature poly-silicon (LTPS) process. Furthermore, each of the first transistor M1, the second transistor M2, the fifth transistor M5, the sixth transistor M6, and the seventh transistor M7 may be a P-type transistor (e.g., a PMOS transistor). Therefore, a gate-on voltage for turning on the first transistor M1, the second transistor M2, the fifth transistor M5, the sixth transistor M6, or the seventh transistor M7 may have a logic low level.

Because a poly-silicon semiconductor transistor has an advantage of a high response speed, the poly-silicon semiconductor transistor may be applied to a switching element in which a high-speed switching operation is required.

In an embodiment, each of the third transistor M3 and the fourth transistor M4 may be formed as an oxide semiconductor transistor. For example, each of the third transistor M3 and the fourth transistor M4 may be formed as an N-type oxide semiconductor transistor (e.g., an NMOS transistor), and include an oxide semiconductor layer as an active layer. Hence, a gate-on voltage for turning on the third transistor M3 and the fourth transistor M4 may have a logic high level.

The oxide semiconductor transistor may be implemented by a low-temperature process, and have low charge mobility as compared to that of the poly-silicon semiconductor transistor. For example, the oxide semiconductor transistor may have excellent off-current characteristics. Therefore, in case that each of the third transistor M3 and the fourth transistor M4 is formed as an oxide semiconductor transistor, leakage current from the first node N1 resulting from low-frequency driving may be minimized. Thus, the display quality may be enhanced.

Figure 3B:
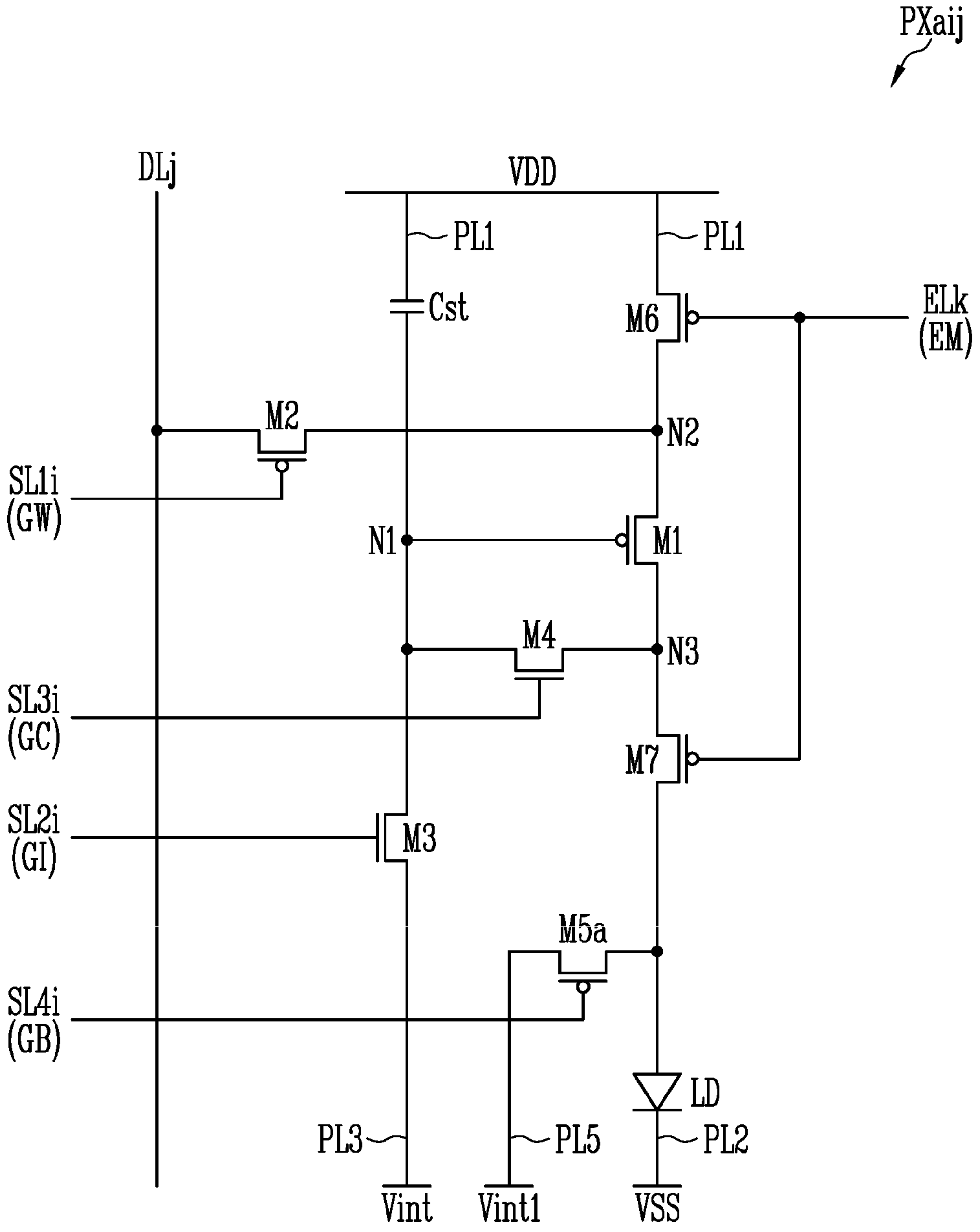
FIG. 3B is a schematic diagram illustrating an embodiment of a pixel shown in FIG. 1.

FIG. 3B is a schematic diagram illustrating an embodiment of a pixel shown in FIG. 1. In FIG. 3B, a pixel PXaij may be positioned on the i-th horizontal line and the j-th vertical line. In the following description of FIG. 3B, redundant explanation pertaining to the same configuration as that of FIG. 3A will be omitted for descriptive convenience.

Referring to FIG. 3B, the pixel PXaij in accordance with an embodiment may be connected to the corresponding signal lines SL1*i*, SL2*i*, SL3*i*, SL4*i*, ELk, and DLj. For example, the pixel PXaij may be connected to the i-th first scan line SL1*i*, the i-th second scan line SL2*i*, the i-th third scan line SL3*i*, the i-th fourth scan line SL4*i*, the k-th emission control line ELk, and the j-th data line DLj. In an embodiment, the pixel PXaij may be also connected to the first power line PL1, the second power line PL2, and the third power line PL3.

The pixel PXaij in accordance with an embodiment may include a light emitting element LD, and a pixel circuit that controls the amount of the current, which is supplied to the light emitting element LD.

The light emitting elements LD may be connected between the first power line PL1 and the second power line PL2. The light emitting element LD may generate light having a luminance corresponding to the amount of driving current that is supplied from the first power line PL1 to the second power line PL2 via the pixel circuit.

The pixel circuit may include a first transistor M1, a second transistor M2, a third transistor M3, a fourth transistor M4, a fifth transistor M5*a*, a sixth transistor M6, a seventh transistor M7, and a storage capacitor Cst.

The fifth transistor M5*a* may include a first electrode connected to the first electrode of the light emitting element LD, and a second electrode electrically connected to a fifth power line PL5 for the supply of the voltage of a first initialization power supply Vint1. A gate electrode of the fifth transistor M5*a* may be electrically connected to the fourth scan line SL4*i*. In case that a fourth scan signal GB is supplied to the fourth scan line SL4*i*, the fifth transistor M5*a* may be turned on so that the voltage of the first initialization power supply Vint1 may be supplied to the first electrode of light emitting element LD.

While the pixel PXij illustrated in FIG. 3A supplies the voltage of the initialization power supply Vint to the first electrode of the light emitting element LD in case that the fifth transistor M5 is turned on, the pixel PXaij illustrated in FIG. 3B supplies the voltage of the first initialization power supply Vint1 to the first electrode of the light emitting element LD in case that the fifth transistor M5*a* is turned on.

In the pixel PXaij of FIG. 3B, the initialization power supply Vint and the first initialization power supply Vint1 may be set to different voltages. For example, the initialization power supply Vint may be set to a voltage capable of reliably initializing the first node N1. The first initialization power supply Vint1 may be set to a voltage capable of reliably initializing the light emitting element LD.

Figure 4:
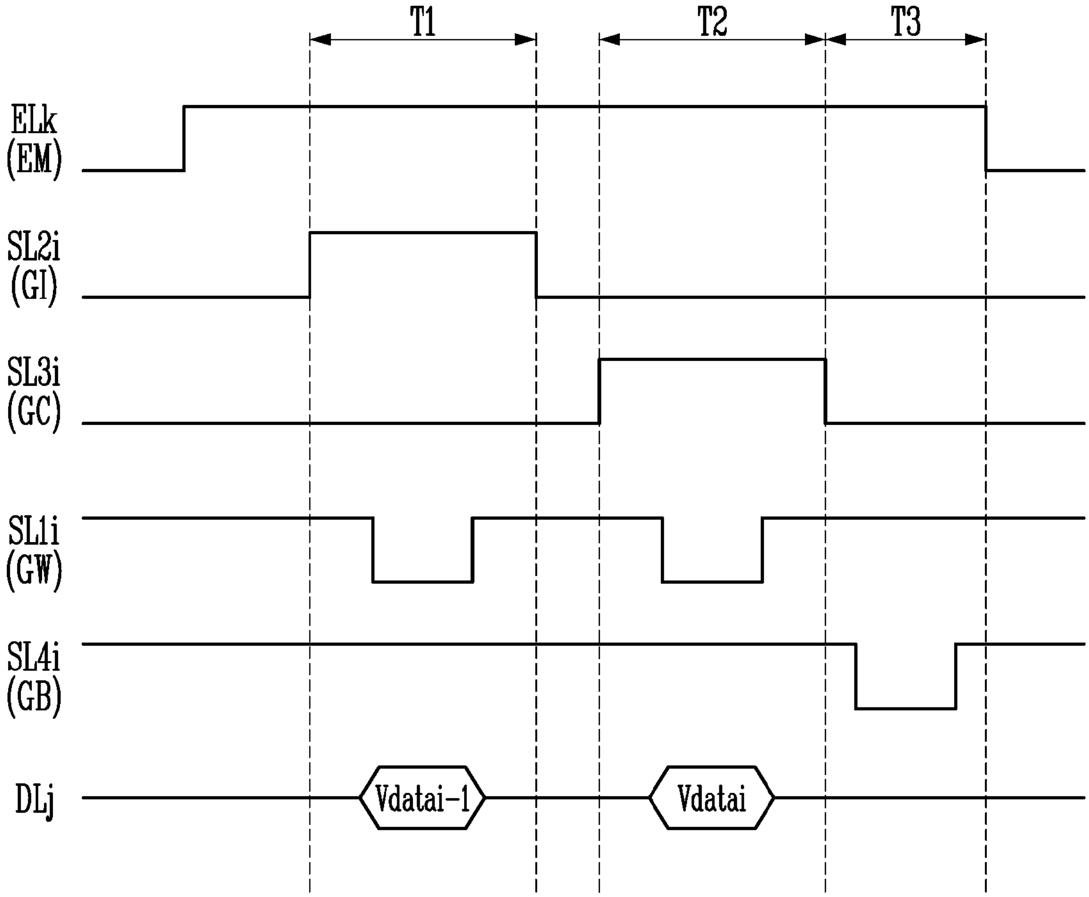
FIG. 4 is a waveform diagram illustrating an embodiment of a method of driving the pixel shown in FIGS. 3A and 3B.

FIG. 4 is a waveform diagram illustrating an embodiment of a method of driving the pixel PXij shown in FIGS. 3A and 3B. Hereinafter, driving waveforms in FIG. 4 will be described in conjunction with the pixel PXij of FIG. 3A.

Referring to FIG. 4, a period in which the pixel PXij positioned on the i-th horizontal line and the j-th vertical line is driven may be divided into a first period T1, a second period T2, and a third period T3. Here, the first period T1, the second period T2, and the third period T3 may be included in one frame period.

The data driver 140 may supply voltages Vdatai-1 and Vdatai of a data signal to the data line DLj. In an embodiment, the data driver 140 may supply the voltage Vdatai-1 of the data signal corresponding to an (i-1)-th horizontal line during the first period T1, and may supply the voltage Vdatai of the data signal corresponding to the i-th horizontal line during the second period T2. In an embodiment, the data driver 140 may supply a voltage of the data signal to the data line DLj in each horizontal period.

The first scan driver 132 may supply at least two or more first scan signals GW to an i-th first scan line SL1*i*. For example, the first scan driver 132 may supply a first scan signal GW (or a 1st first scan signal) to the i-th first scan line SL1*i* during the first period T1, and may supply a first scan signal GW (or a 2nd first scan signal) to the i-th first scan line SL1*i* during the second period T2.

The second scan driver 134 may supply a second scan signal GI to an i-th second scan line SL2*i* during the first period T1. Here, the second scan signal GI supplied to the i-th second scan line SL2*i* during the first period T1 may overlap the first scan signal GW supplied to the i-th first scan line SL1*i* during the first period T1.

The third scan driver 136 may supply a third scan signal GC to an i-th third scan line SL3*i* during the second period T2. Here, the third scan signal GC supplied to the i-th third scan line SL3*i* during the second period T2 may overlap the first scan signal GW supplied to the i-th first scan line SL1*i* during the second period T2.

The fourth scan driver 138 may supply a fourth scan signal GB to an i-th fourth scan line SL4*i* during the third period T3. The third period T3 may be a period during which a voltage of the data signal corresponding to an (i+1)-th horizontal line is supplied to the data line DLj.

The emission driver 150 may supply an emission control signal EM to the emission control line ELk during the first period T1 to the third period T3. For example, the pixel PXij may be set to a non-emission state during the first period T1 to the third period T3.

The operation process will be described in detail with reference to FIGS. 3A and 4. First, the emission control signal EM is supplied to the emission control line ELk during the first period T1 to the third period T3. As a result, the sixth transistor M6 and the seventh transistor M7 is turned off.

In case that the sixth transistor M6 is turned off, the first power line PL1 and the second node N2 are electrically disconnected from each other. In case that the seventh transistor M7 is turned off, the third node N3 and the light emitting element LD may be electrically disconnected from each other. Therefore, during the first period T1 to the third period T3 in which the emission control signal EM is supplied to the emission control line ELk, the light emitting element LD may be set to a non-emission state.

During the first period T1, the first scan signal GW may be supplied to the first scan line SL1*i*, and the second scan signal GI may be supplied to the second scan line SL2*i*. In case that the first scan signal GW is supplied to the first scan line SL1*i*, the second transistor M2 is turned on. In case that the second transistor M2 is turned on, the voltage Vdatai-1 of the data signal (or the data signal of the previous horizontal line) corresponding to the pixel positioned on the (i-1)-th horizontal line may be supplied to the second node N2.

In case that the second scan signal GI is supplied to the second scan line SL2*i*, the third transistor M3 may be turned on. In case that the third transistor M3 is turned on, the voltage of the initialization power supply Vint may be supplied to the first node N1. In case that the voltage of the initialization power supply Vint is supplied to the first node N1, the first node N1 may be initialized by the voltage of the initialization power supply Vint.

During the first period T1, the first node N1 may be set to the voltage of the initialization power supply Vint, and the second node N2 may be supplied with the voltage Vdatai-1 of the data signal of the previous horizontal line. Here, the voltage Vdatai-1 of the data signal of the previous horizontal line may be set to a voltage higher than the voltage of the initialization power supply Vint. Hence, during the first period T1, the first transistor M1 may be set to an on-bias state (or an on-bias voltage application state). In the case where the first transistor M1 is set to the on-bias state, a characteristic curve of the first transistor M1 may be initialized regardless of a data signal of a previous frame, thereby compensating the hysteresis of the first transistor M1.

During the second period T2, the first scan signal GW may be supplied to the first scan line SL1*i*, and the third scan signal GC may be supplied to the third scan line SL3*i*. In case that the first scan signal GW is supplied to the first scan line SL1*i*, the second transistor M2 is turned on. In case that the second transistor M2 is turned on, the voltage Vdatai of the data signal corresponding to a current horizontal line may be supplied to the second node N2.

In case that the third scan signal GC is supplied to the third scan line SL3*i*, the fourth transistor M4 is turned on. In case that the fourth transistor M4 is turned on, the first transistor M1 may be connected in the form of a diode. For example, the voltage Vdatai of the data signal supplied to the second node N2 may be supplied to the first node N1 via the first transistor M1 connected in the form of a diode. Therefore, a voltage corresponding both to the voltage Vdatai of the data signal and to the threshold voltage of the first transistor M1 may be applied to the first node N1. The storage capacitor Cst may store the voltage applied to the first node N1.

During the third period T3, the fourth scan signal GB may be supplied to the fourth scan line SL4*i*. In case that the fourth scan signal GB is supplied to the fourth scan line SL4*i*, the fifth transistor M5 is turned on. In case that the fifth transistor M5 is turned on, the voltage of the initialization power supply Vint may be supplied to the first electrode of the light emitting element LD, thereby initializing the light emitting element LD.

After the third period T3, the supply of the emission control signal EM to the emission control line ELk may be interrupted. In case that the supply of the emission control signal EM to the emission control line ELk is interrupted, the sixth transistor M6 and the seventh transistor M7 may be turned on. In case that the sixth transistor M6 is turned on, the first power line PL1 and the second node N2 may be electrically connected to each other. In case that the seventh transistor M7 is turned on, the third node N3 and the light emitting element LD may be electrically connected to each other.

Here, the first transistor M1 may control, in response to the first node N1, the amount of the current, which is supplied from the first driving power supply VDD to the second driving power supply VSS via the light emitting element LD. The light emitting element LD may emit light at a luminance corresponding to the amount of the current supplied from the first transistor M1.

Figure 5:
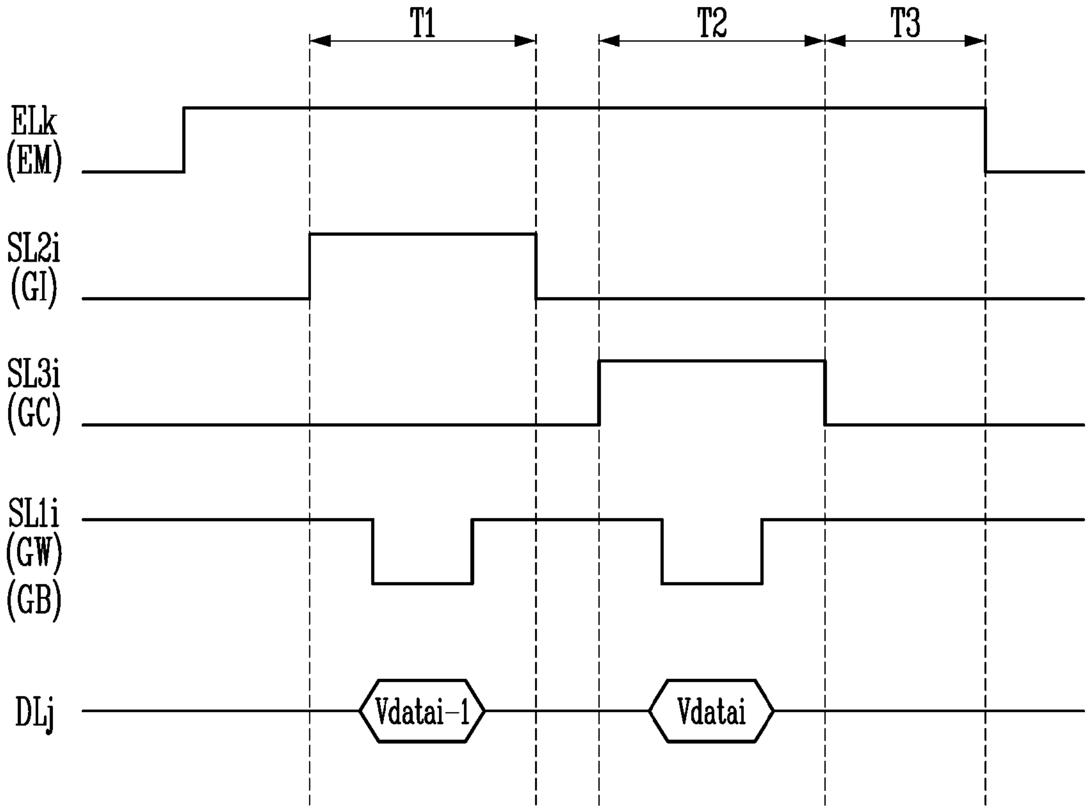
FIG. 5 is a waveform diagram illustrating an embodiment of a method of driving the pixel shown in FIGS. 3A and 3B.

FIG. 5 is a waveform diagram illustrating an embodiment of a method of driving the pixel shown in FIGS. 3A and 3B. In the following description of FIG. 5, redundant explanation pertaining to the same configuration as that of FIG. 4 will be omitted for descriptive convenience.

Referring to FIGS. 3A and 5, the fourth scan signal GB may be set to the same signal as the first scan signal GW. For example, the fourth scan line SL4*i* may be set to the same scan line as the first scan line SL1*i*, and the fourth scan driver 138 illustrated in FIG. 2 may be omitted.

The fifth transistor M5 may be turned on in response to the first scan signal GW during the first period T1 and the second period T2. In case that the fifth transistor M5 is turned on, the voltage of the initialization power supply Vint may be supplied to the first electrode of the light emitting element LD, thereby initializing the light emitting element LD. The other operations of the pixel PXij are the same as those described with reference to the driving waveforms of FIG. 4; therefore, redundant explanation thereof will be omitted for descriptive convenience.

Figure 6A:
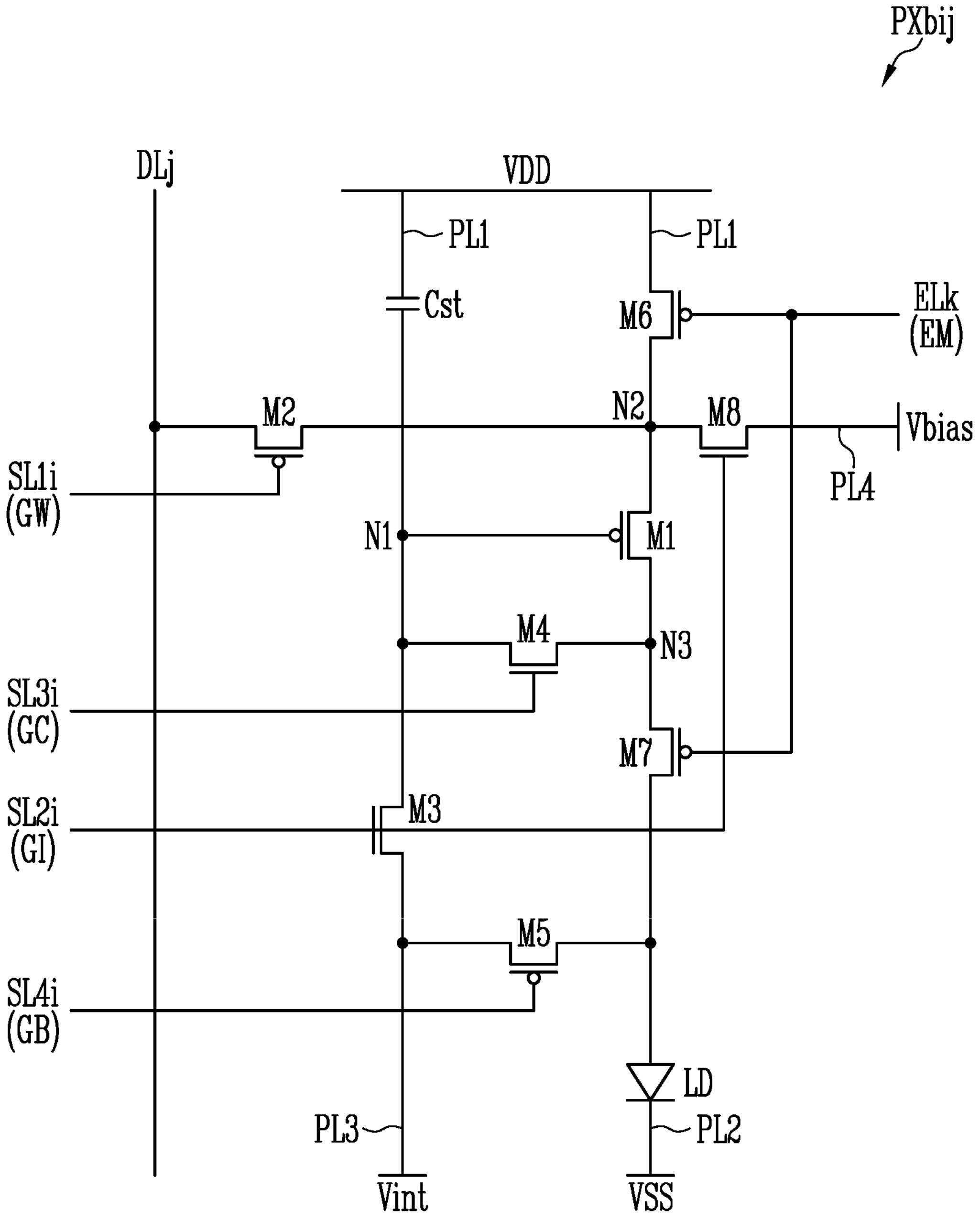
FIG. 6A is a schematic diagram illustrating an embodiment of a pixel shown in FIG. 1.

FIG. 6A is a schematic diagram illustrating an embodiment of a pixel illustrated in FIG. 1. In FIG. 6A, a pixel PXbij may be positioned on the i-th horizontal line and the j-th vertical line. In the following description of FIG. 6A, redundant explanation pertaining to the same configuration as that of FIG. 3A will be omitted for descriptive convenience.

Referring to FIG. 6A, the pixel PXbij in accordance with an embodiment may be connected to corresponding signal lines SL1*i*, SL2*i*, SL3*i*, SL4*i*, ELk, and DLj. For example, the pixel PXbij may be connected to the i-th first scan line SL1*i*, the i-th second scan line SL2*i*, the i-th third scan line SL3*i*, the i-th fourth scan line SL4*i*, the k-th emission control line ELk, and the j-th data line DLj. In an embodiment, the pixel PXbij may be also connected to the first power line PL1, the second power line PL2, and the third power line PL3.

The pixel PXbij in accordance with an embodiment may include a light emitting element LD, and a pixel circuit that controls the amount of the current, which is supplied to the light emitting element LD.

The light emitting element LD may be connected between the first power line PL1 and the second power line PL2. The light emitting element LD may generate light having a luminance corresponding to the amount of driving current that is supplied from the first power line PL1 to the second power line PL2 via the pixel circuit.

The pixel circuit may include a first transistor M1, a second transistor M2, a third transistor M3, a fourth transistor M4, a fifth transistor M5, a sixth transistor M6, a seventh transistor M7, an eighth transistor M8, and a storage capacitor Cst.

The eighth transistor M8 (or a bias transistor) may include a first electrode electrically connected to a fourth power line PL4, and a second electrode connected to the second node N2. A gate electrode of the eighth transistor M8 may be electrically connected to the second scan line SL2*i*. In case that a second scan signal GI is supplied to the second scan line SL2*i*, the eighth transistor M8 may be turned on to electrically connect the fourth power line PL4 to the second node N2.

In an embodiment, the eighth transistor M8 may be formed as an oxide semiconductor transistor. For example, the eighth transistor M8 may be an N-type oxide semiconductor transistor (e.g., an NMOS transistor), and include an oxide semiconductor layer as an active layer. Hence, a gate-on voltage for turning on the eighth transistor M8 may have a logic high level.

In an embodiment, a bias power supply Vbias may be set to a voltage higher than that of the initialization power supply Vint. In an embodiment, the bias power supply Vbias may be set to a voltage lower than that of a black data signal.

Figure 6B:
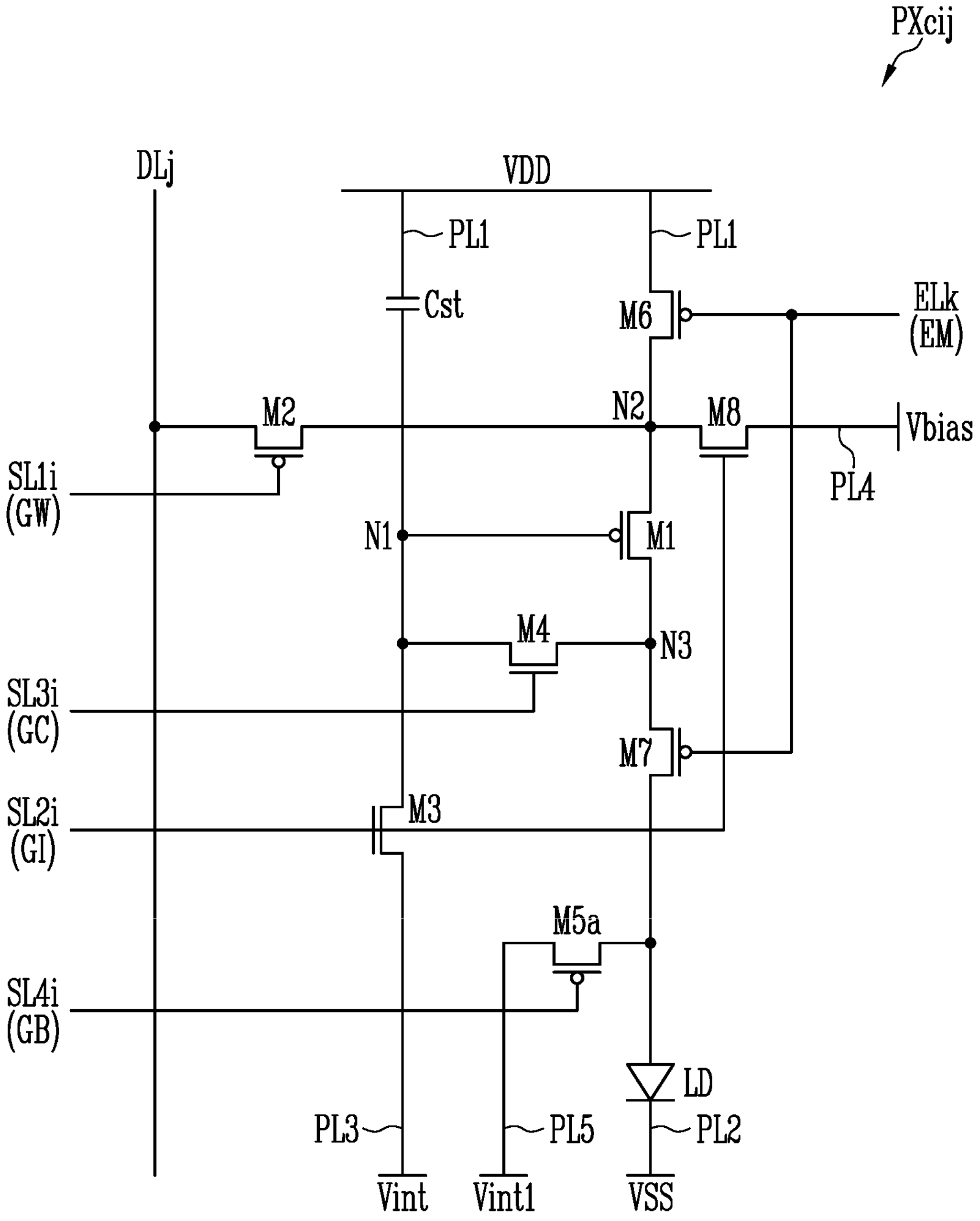
FIG. 6B is a schematic diagram illustrating an embodiment of a pixel shown in FIG. 1.

FIG. 6B is a schematic diagram illustrating an embodiment of a pixel shown in FIG. 1. In FIG. 6B, a pixel PXcij may be positioned on the i-th horizontal line and the j-th vertical line. In the following description of FIG. 6B, redundant explanation pertaining to the same configuration as that of FIG. 6A will be omitted for descriptive convenience.

Referring to FIG. 6B, the pixel PXcij in accordance with an embodiment may be connected to the corresponding signal lines SL1*i*, SL2*i*, SL3*i*, SL4*i*, ELk, and DLj. For example, the pixel PXcij may be connected to the i-th first scan line SL1*i*, the i-th second scan line SL2*i*, the i-th third scan line SL3*i*, the i-th fourth scan line SL4*i*, the k-th emission control line ELk, and the j-th data line DLj. In an embodiment, the pixel PXcij may be also connected to the first power line PL1, the second power line PL2, and the third power line PL3.

The pixel PXcij in accordance with an embodiment may include a light emitting element LD, and a pixel circuit that controls the amount of the current, which is supplied to the light emitting element LD.

The light emitting element LD may be connected between the first power line PL1 and the second power line PL2. The light emitting element LD may generate light having a luminance corresponding to the amount of driving current that is supplied from the first power line PL1 to the second power line PL2 via the pixel circuit.

The pixel circuit may include a first transistor M1, a second transistor M2, a third transistor M3, a fourth transistor M4, a fifth transistor M5*a*, a sixth transistor M6, a seventh transistor M7, an eighth transistor M8, and a storage capacitor Cst.

The fifth transistor M5*a* may include a first electrode connected to the first electrode of the light emitting element LD, and a second electrode electrically connected to a fifth power line PL5 for the supply of first initialization power supply Vint1. A gate electrode of the fifth transistor M5*a* may be electrically connected to the fourth scan line SL4*i*. In case that a fourth scan signal GB is supplied to the fourth scan line SL4*i*, the fifth transistor M5*a* may be turned on so that the voltage of the first initialization power supply Vint1 may be supplied to the first electrode of light emitting element LD.

While the pixel PXbij illustrated in FIG. 6A supplies the voltage of the initialization power supply Vint to the first electrode of the light emitting element LD in case that the fifth transistor M5 is turned on, the pixel PXcij illustrated in FIG. 6B supplies the voltage of the first initialization power supply Vint1 to the first electrode of the light emitting element LD in case that the fifth transistor M5*a* is turned on.

In the pixel PXcij of FIG. 6B, the initialization power supply Vint and the first initialization power supply Vint1 may be set to different voltages. For example, the initialization power supply Vint may be set to a voltage capable of reliably initializing the first node N1. The first initialization power supply Vint1 may be set to a voltage capable of reliably initializing the light emitting element LD.

Figure 7:
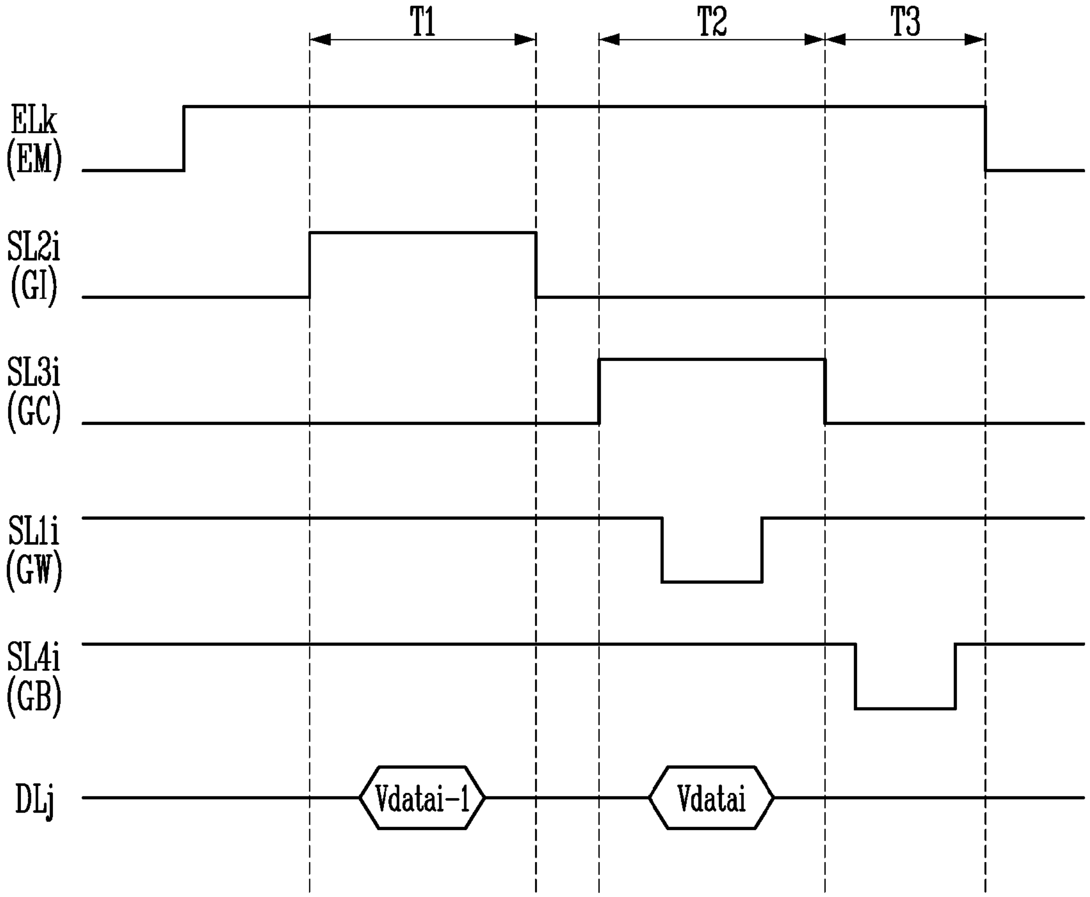
FIG. 7 is a waveform diagram illustrating an embodiment of a method of driving the pixel shown in FIGS. 6A and 6B.

FIG. 7 is a waveform diagram illustrating an embodiment of a method of driving the pixel shown in FIGS. 6A and 6B. Hereinafter, driving waveforms in FIG. 7 will be described in conjunction with the pixel PXbij of FIG. 6A.

Referring to FIG. 7, a period in which the pixel PXbij positioned on the i-th horizontal line and the j-th vertical line is driven may be divided into a first period T1, a second period T2, and a third period T3. Here, the first period T1, the second period T2, and the third period T3 may be included in one frame period.

The data driver 140 may supply voltages Vdatai-1 and Vdatai of a data signal to the data line DLj. In an embodiment, the data driver 140 may supply the voltage Vdatai-1 of the data signal corresponding to the (i-1)-th horizontal line during the first period T1, and may supply the voltage Vdatai of the data signal corresponding to the i-th horizontal line during the second period T2. In an embodiment, the data driver 140 may supply a voltage of the data signal to the data line DLj in each horizontal period.

The first scan driver 132 may supply a first scan signal GW to the i-th first scan line SL1*i* during the second period T2.

The second scan driver 134 may supply a second scan signal GI to the i-th second scan line SL2*i* during the first period T1.

The third scan driver 136 may supply a third scan signal GC to the i-th third scan line SL3*i* during the second period T2. Here, the third scan signal GC supplied to the i-th third scan line SL3*i* during the second period T2 may overlap the first scan signal GW supplied to the i-th first scan line SL1*i* during the second period T2.

The fourth scan driver 138 may supply a fourth scan signal GB to the i-th fourth scan line SL4*i* during the third period T3. The third period T3 may be a period during which a voltage of the data signal corresponding to the (i+1)-th horizontal line is supplied to the data line DLj.

The emission driver 150 may supply an emission control signal EM to the emission control line ELk during the first period T1 to the third period T3. For example, the pixel PXbij may be set to a non-emission state during the first period T1 to the third period T3.

The operation process will be described in detail with reference to FIGS. 6A and 7. First, the emission control signal EM is supplied to the emission control line Elk during the first period T1 to the third period T3. As a result, the sixth transistor M6 and the seventh transistor M7 may be turned off.

In case that the sixth transistor M6 is turned off, the first power line PL1 and the second node N2 may be electrically disconnected from each other. In case that the seventh transistor M7 is turned off, the third node N3 and the light emitting element LD may be electrically disconnected from each other. Therefore, during the first period T1 to the third period T3 in which the emission control signal EM is supplied to the emission control line ELk, the light emitting element LD may be set to a non-emission state.

During the first period T1, the second scan signal GI may be supplied to the second scan line SL2*i*. In case that the second scan signal GI is supplied to the second scan line SL2*i*, the third transistor M3 and the eighth transistor M8 may be turned on.

In case that the third transistor M3 is turned on, the voltage of the initialization power supply Vint may be supplied to the first node N1. In case that the voltage of the initialization power supply Vint is supplied to the first node N1, the first node N1 may be initialized by the voltage of the initialization power supply Vint.

In case that the eighth transistor M8 is turned on, the voltage of the bias power supply Vbias may be supplied to the second node N2. Here, the bias power supply Vbias may be set to a voltage higher than the voltage of the initialization power supply Vint. Hence, during the first period T1, the first transistor M1 may be set to an on-bias state (or an on-bias voltage application state). In the case where the first transistor M1 is set to the on-bias state, a characteristic curve of the first transistor M1 may be initialized regardless of a data signal of a previous frame, thereby compensating the hysteresis of the first transistor M1.

During the second period T2, the first scan signal GW may be supplied to the first scan line SL1*i*, and the third scan signal GC may be supplied to the third scan line SL3*i*. In case that the first scan signal GW is supplied to the first scan line SL1*i*, the second transistor M2 may be turned on. In case that the second transistor M2 is turned on, the voltage Vdatai of the data signal corresponding to a current horizontal line may be supplied to the second node N2.

In case that the third scan signal GC is supplied to the third scan line SL3*i*, the fourth transistor M4 may be turned on. In case that the fourth transistor M4 is turned on, the first transistor M1 may be connected in the form of a diode. For example, the voltage Vdatai of the data signal supplied to the second node N2 may be supplied to the first node N1 via the first transistor M1 connected in the form of a diode. Therefore, a voltage corresponding to both the voltage Vdatai of the data signal and the threshold voltage of the first transistor M1 may be applied to the first node N1. The storage capacitor Cst may store the voltage applied to the first node N1.

During the third period T3, the fourth scan signal GB may be supplied to the fourth scan line SL4*i*. In case that the fourth scan signal GB is supplied to the fourth scan line SL4*i*, the fifth transistor M5 may be turned on. In case that the fifth transistor M5 is turned on, the voltage of the initialization power supply Vint may be supplied to the first electrode of the light emitting element LD, thereby initializing the light emitting element LD.

After the third period T3, the supply of the emission control signal EM to the emission control line Elk is interrupted. In case that the supply of the emission control signal EM to the emission control line ELk is interrupted, the sixth transistor M6 and the seventh transistor M7 may be turned on. In case that the sixth transistor M6 is turned on, the first power line PL1 and the second node N2 may be electrically connected to each other. In case that the seventh transistor M7 is turned on, the third node N3 and the light emitting element LD may be electrically connected to each other.

Here, the first transistor M1 may control, in response to the first node N1, the amount of the current, which is supplied from the first driving power supply VDD to the second driving power supply VSS via the light emitting element LD. The light emitting element LD may emit light at a luminance corresponding to the amount of the current supplied from the first transistor ML.

Figure 8:
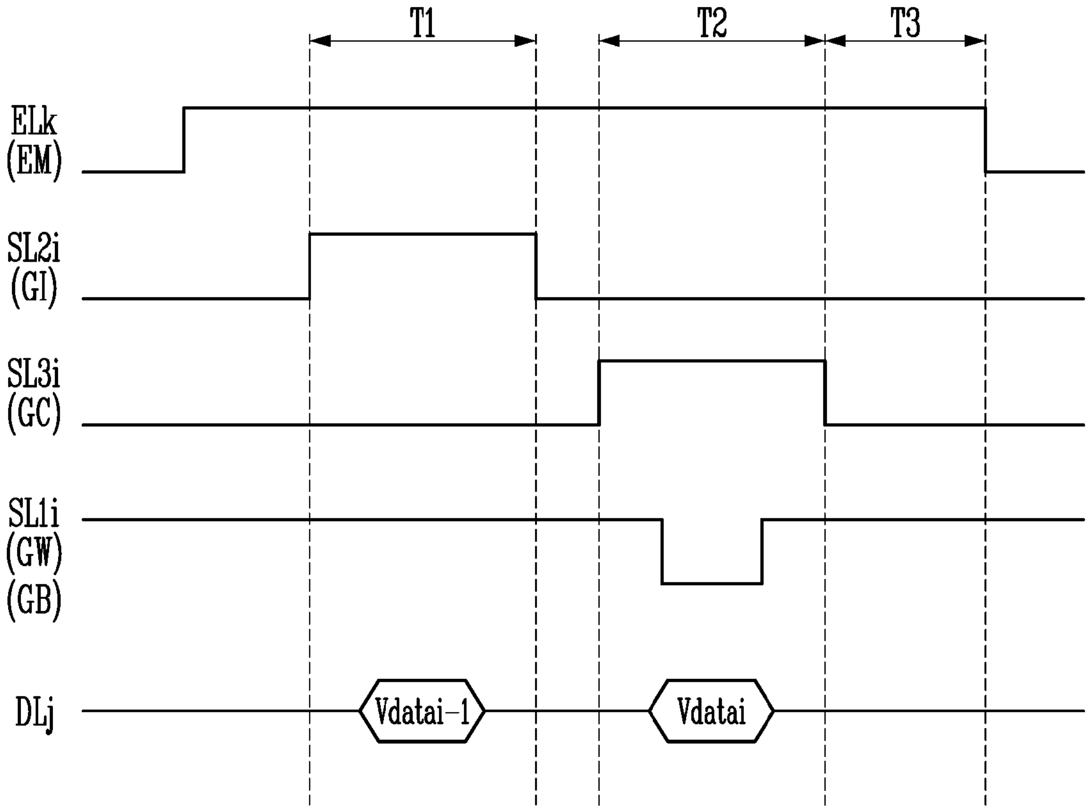
FIG. 8 is a waveform diagram illustrating an embodiment of a method of driving the pixel shown in FIGS. 6A and 6B.

FIG. 8 is a waveform diagram illustrating an embodiment of a method of driving the pixel shown in FIGS. 6A and 6B. In the following description of FIG. 8, redundant explanation pertaining to the same configuration as that of FIG. 7 will be omitted for descriptive convenience.

Referring to FIGS. 6A and 8, the fourth scan signal GB and the first scan signal GW may be set to the same signal as each other. For example, the fourth scan line SL4*i* and the first scan line SL1*i* may be set to the same scan line as each other, and the fourth scan driver 138 illustrated in FIG. 2 may be omitted.

The fifth transistor M5 may be turned on in response to the first scan signal GW during the second period T2. In case that the fifth transistor M5 is turned on, the voltage of the initialization power supply Vint may be supplied to the first electrode of the light emitting element LD, thereby initializing the light emitting element LD. The remaining operation process of the pixel PXbij is the same as that in the driving waveform of FIG. 7; therefore, redundant explanation thereof will be omitted for descriptive convenience.

Figure 9:
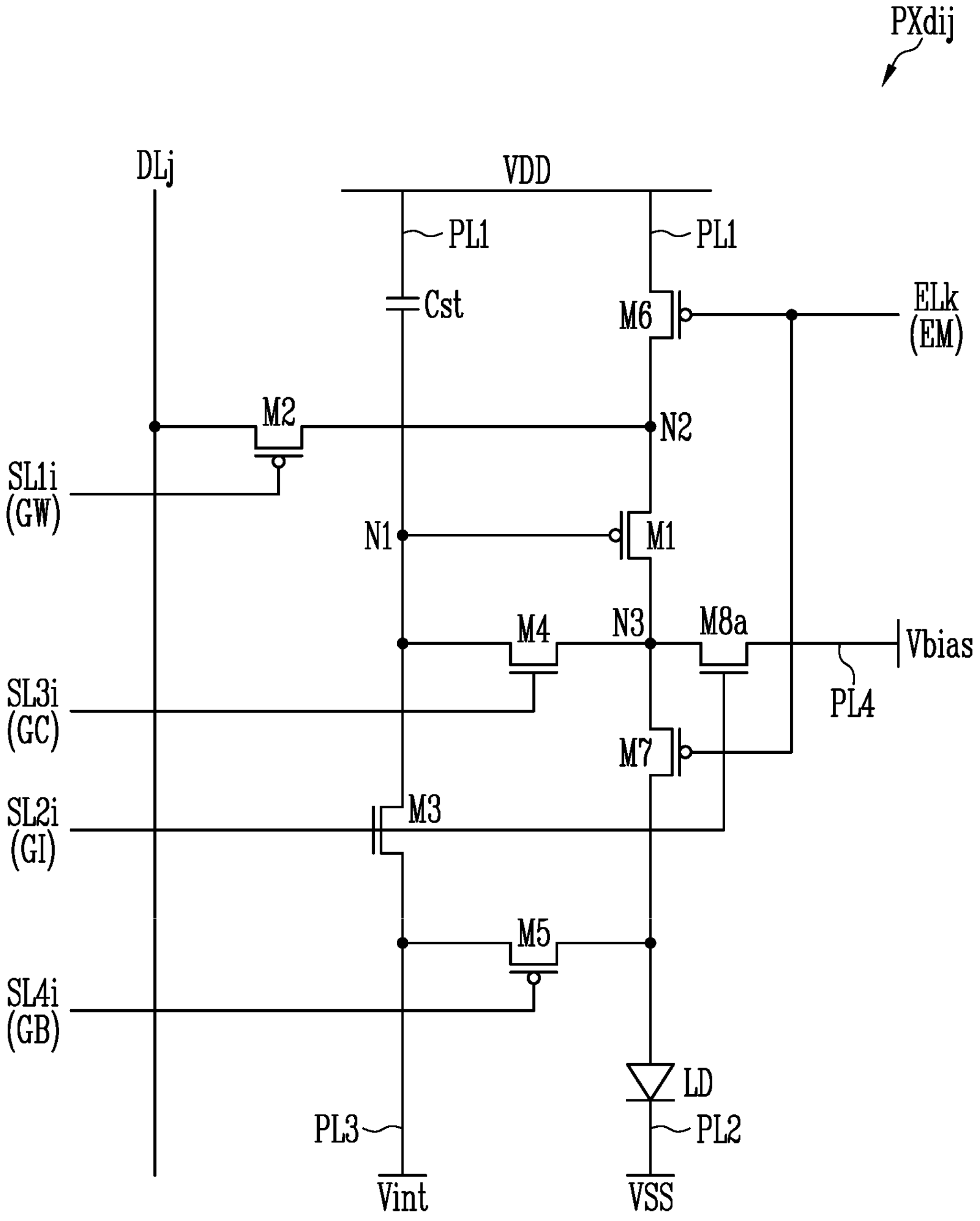
FIG. 9 is a schematic diagram illustrating an embodiment of a pixel shown in FIG. 1.

FIG. 9 is a schematic diagram illustrating an embodiment of a pixel shown in FIG. 1. In FIG. 9, the pixel may be positioned on the i-th horizontal line and the j-th vertical line. In the following description of FIG. 9, redundant explanation pertaining to the same configuration as that of FIG. 6A will be omitted for descriptive convenience.

Referring to FIG. 9, the pixel PXdij in accordance with an embodiment may be connected to corresponding signal lines SL1*i*, SL2*i*, SL3*i*, SL4*i*, ELk, and DLj. For example, the pixel PXdij may be connected to the i-th first scan line SL1*i*, the i-th second scan line SL2*i*, the i-th third scan line SL3*i*, the i-th fourth scan line SL4*i*, the k-th emission control line ELk, and the j-th data line DLj. In an embodiment, the pixel PXdij may be also connected to the first power line PL1, the second power line PL2, and the third power line PL3.

The pixel PXdij in accordance with an embodiment may include a light emitting element LD, and a pixel circuit that controls the amount of the current, which is supplied to the light emitting element LD.

The light emitting element LD may be connected between the first power line PL1 and the second power line PL2. The light emitting element LD may generate light having a luminance corresponding to the amount of driving current that is supplied from the first power line PL1 to the second power line PL2 via the pixel circuit.

The pixel circuit may include a first transistor M1, a second transistor M2, a third transistor M3, a fourth transistor M4, a fifth transistor M5, a sixth transistor M6, a seventh transistor M7, an eighth transistor M8*a*, and a storage capacitor Cst.

The eighth transistor M8*a* (or a bias transistor) may include a first electrode electrically connected to the fourth power line PL4, and a second electrode connected to the third node N3. A gate electrode of the eighth transistor M8*a* may be electrically connected to the second scan line SL2*i*. In case that a second scan signal GI is supplied to the second scan line SL2*i*, the eighth transistor M8*a* may be turned on to electrically connect the fourth power line PL4 to the second node N2.

The pixel PXdij illustrated in FIG. 9 may have the same configuration and driving method as the pixel PXbij of FIG. 6A, except for the connection of the eighth transistor M8*a* to the third node N3. Hence, detailed explanation pertaining to the driving method will be omitted for descriptive convenience.

Figure 10:
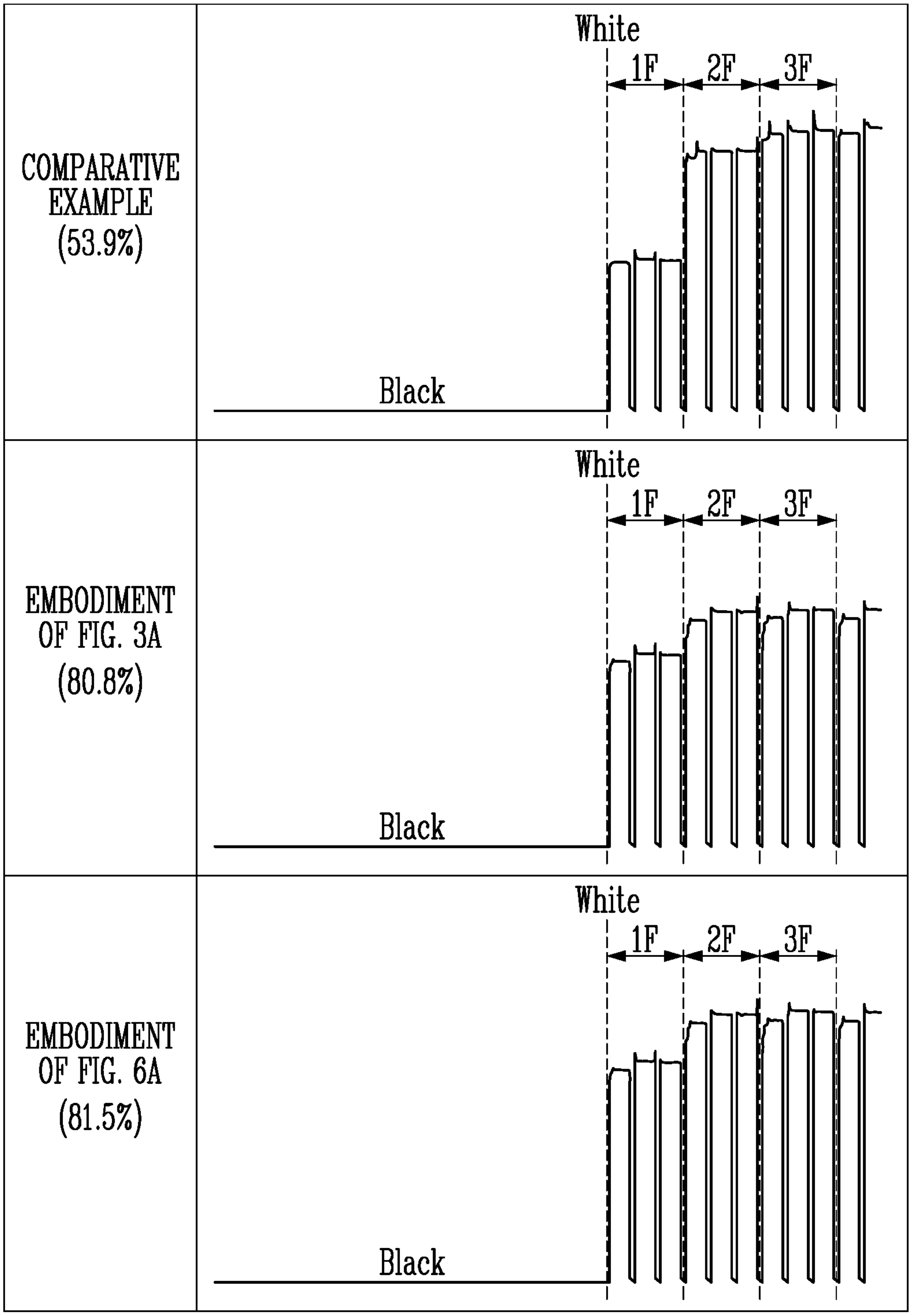
FIG. 10 is a schematic diagram illustrating the result of a simulation in accordance with an embodiment.

FIG. 10 is a schematic diagram illustrating the result of a simulation in accordance with an embodiment. In FIG. 10, an embodiment of FIG. 3A represents the case where the pixel PXij illustrated in FIG. 3A is driven according to the driving waveforms of FIG. 5. In FIG. 10, an embodiment of FIG. 6A represents the case where the pixel PXbij illustrated in FIG. 6A is driven according to the driving waveforms of FIG. 8. In FIG. 10, a comparative example represents the case where the pixel PXij of FIG. 3A that is driven according to the driving waveforms of FIG. 5 is not supplied with the first scan signal GW during the first period T1.

FIG. 10 illustrates a difference in luminance between a first frame 1F and a third frame 3F in the case where a black data signal Black is supplied during a certain period and then a white data signal White is supplied.

Referring to FIG. 10, in the case of the comparative example, the luminance of the pixel in the first frame 1F may be set to approximately 53.9% compared to the third frame 3F. In the case of the comparative example, the first transistor M1 included in the pixel may not be initialized to the on-bias state. Thus, the pixel may generate light with relatively low luminance during the first frame 1F.

In an embodiment, in the first frame 1F, the luminance of the pixel PXij of FIG. 3A may be set to approximately 80.8% compared to the third frame 3F. For example, the first transistor M1 included in the pixel PXij of FIG. 3A may be initialized to the on-bias state. Hence, the pixel PXij of FIG. 3A may generate light with relatively high luminance in the first frame 1F, as compared to the comparative example.

In an embodiment, in the first frame 1F, the luminance of the pixel PXbij of FIG. 6A may be set to approximately 81.5% compared to the third frame 3F. For example, the first transistor M1 included in the pixel PXbij of FIG. 6A may be initialized to the on-bias state. Hence, the pixel PXbij of FIG. 6A may generate light with relatively high luminance in the first frame 1F, compared to the comparative example.

In a pixel and a display device including the pixel in accordance with embodiments, a driving transistor included in each pixel may be set to an on-bias state before supply of a data signal. For example, the characteristics of the driving transistor may be initialized to the on-bias state before the supply of the data signal, thus preventing a momentary residual image phenomenon or the like from occurring.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A pixel comprising:
a first transistor including:
a gate electrode connected to a first node,
a first electrode connected to a first power line via a second node, the first power line that receives a first driving power voltage, and
a second electrode connected to a third node;
a light emitting element including:
a first electrode connected to the third node, and
a second electrode connected to a second power line that receives a second driving power voltage;
a second transistor connected between a data line and the second node, and including a gate electrode electrically connected to a first scan line; and
a third transistor connected between the first node and a third power line that receives an initialization power voltage, and including a gate electrode electrically connected to a second scan line, wherein
the second transistor is set to a turn-on state during at least a partial period of a turn-on period of the third transistor, and
the initialization power voltage is set to a voltage lower than a data signal to be supplied to the data line.

2. The pixel of claim 1, further comprising:
a fourth transistor connected between the first node and the third node, and including a gate electrode electrically connected to a third scan line.

3. The pixel of claim 2, wherein
the second transistor is set to a turn-on state during at least a partial period of a turn-on period of the fourth transistor, and
the turn-on period of the third transistor does not overlap the turn-on period of the fourth transistor.

4. The pixel of claim 2, further comprising:
a fifth transistor connected between the first electrode of the light emitting element and the third power line, and including a gate electrode electrically connected to a fourth scan line.

5. The pixel of claim 4, wherein
the fifth transistor and the second transistor are turned on or turned off simultaneously, and
the fourth scan line and the first scan line are set to a same scan line.

6. The pixel of claim 4, wherein the fifth transistor is turned on during at least a partial period after the second transistor is turned on or turned off.

7. The pixel of claim 4, further comprising:
a sixth transistor connected between the first power line and the second node, and including a gate electrode electrically connected to an emission control line; and
a seventh transistor connected between the third node and the first electrode of the light emitting element, and including a gate electrode electrically connected to the emission control line.

8. A display device comprising:
pixels connected to first scan lines, second scan lines, third scan lines, fourth scan lines, data lines, and emission control lines, wherein
a pixel among the pixels positioned on an i-th pixel row and a j-th pixel column, where i and j are an integer of 0 or more, comprises:
a first transistor comprising:
a gate electrode connected to a first node,
a first electrode connected to a first power line via a second node, the first power line that receives a first driving power voltage, and
a second electrode connected to a third node;
a light emitting element comprising:
a first electrode connected to the third node, and
a second electrode connected to a second power line that receives a second driving power voltage;
a second transistor connected between a j-th data line and the second node, and configured to be turned on in case that a first scan signal is supplied to an i-th first scan line; and
a third transistor connected between the first node and a third power line that receives an initialization power voltage, and configured to be turned on in case that a second scan signal is supplied to an i-th second scan line,
during one frame period, at least two or more first scan signals are supplied to the i-th first scan line, and
the second scan signal supplied to the i-th second scan line overlaps one of the at least two or more first scan signals supplied to the i-th first scan line.

9. The display device of claim 8, wherein
the pixel positioned on the i-th pixel row and the j-th pixel column further comprises:

a fourth transistor connected between the first node and the third node, and configured to be turned on in case that a third scan signal is supplied to an i-th third scan line;

a fifth transistor connected between the first electrode of the light emitting element and the third power line, and configured to be turned on in case that a fourth scan signal is supplied to an i-th fourth scan line;

a sixth transistor connected between the first power line and the second node, and configured to be turned off in case that an emission control signal is supplied to a k-th emission control line, where k is an integer of 0 or more; and a seventh transistor connected between the third node and the first electrode of the light emitting element, and configured to be turned off in case that the emission control signal is supplied to the k-th emission control line.

10. The display device of claim 9, wherein a period during which the pixel positioned on the i-th pixel row and the j-th pixel column is driven is divided into a first period, a second period, and a third period, the display device further comprising:

a data driver that supplies a data signal to the j-th data line;

a first scan driver that supplies the one of the at least two or more first scan signals to the i-th first scan line during the first period, and that supplies another one of the at least two or more first scan signals to the i-th first scan line during the second period;

a second scan driver that supplies a second scan signal to the i-th second scan line during the first period;

a third scan driver that supplies a third scan signal to the i-th third scan line during the second period; and an emission driver that supplies an emission control signal to the k-th emission control line during the first period, the second period, and the third period, and that does not supply the emission control signal to the k-th emission control line during a remaining period.

11. The display device of claim 10, wherein the i-th fourth scan line and the i-th first scan line are set to a same scan line.

12. The display device of claim 10, further comprising:

a fourth scan driver that supplies a fourth scan signal to the i-th fourth scan line during the third period.

13. An electronic device comprising:

a host system to output a control signal;

a timing controller to generate scan driving signal based on the control signal;

a scan driver connected to first scan lines, second scan lines, third scan lines, and fourth scan lines; and pixels connected to the first scan lines, the second scan lines, the third scan lines, the fourth scan lines, data lines, and emission control lines, wherein a pixel among the pixels positioned on an i-th pixel row and a j-th pixel column, where i and j are an integer of 0 or more, comprises:

a first transistor comprising:

a gate electrode connected to a first node, a first electrode connected to a first power line via a second node, the first power line that receives a first driving power voltage, and a second electrode connected to a third node;

a light emitting element comprising:

a first electrode connected to the third node, and a second electrode connected to a second power line that receives a second driving power voltage;

a second transistor connected between a j-th data line and the second node, and configured to be turned on in case that a first scan signal is supplied to an i-th first scan line; and a third transistor connected between the first node and a third power line that receives an initialization power voltage, and configured to be turned on in case that a second scan signal is supplied to an i-th second scan line, during one frame period, at least two or more first scan signals are supplied to the i-th first scan line, and the second scan signal supplied to the i-th second scan line overlaps one of the at least two or more first scan signals supplied to the i-th first scan line.

* * * * *